United States Patent [19]
Wei

[11] Patent Number: 5,346,860
[45] Date of Patent: Sep. 13, 1994

[54] METHOD FOR FABRICATING AN INTERCONNECT STRUCTURE IN AN INTEGRATED CIRCUIT

[75] Inventor: Che-Chia Wei, Plano, Tex.

[73] Assignee: SGS-Thomson Microelectronics, Inc., Carrollton, Tex.

[21] Appl. No.: 88,197

[22] Filed: Jul. 6, 1993

Related U.S. Application Data

[62] Division of Ser. No. 891,450, May 29, 1992, Pat. No. 5,313,084.

[51] Int. Cl.$^5$ .................................... H01L 21/283
[52] U.S. Cl. ................................ 437/200; 437/192
[58] Field of Search ............... 437/200, 192, 193, 228; 148/DIG. 18, DIG. 19, DIG. 147

[56]  References Cited

U.S. PATENT DOCUMENTS

| | | | |
|---|---|---|---|
| 4,751,198 | 6/1988 | Anderson | 437/200 |
| 4,822,749 | 4/1989 | Flanner et al. | |
| 4,977,098 | 12/1990 | Yu et al. | |
| 5,121,186 | 6/1992 | Wong et al. | |
| 5,173,450 | 12/1992 | Wei | |

FOREIGN PATENT DOCUMENTS 2-199838  8/1990  Japan.
0536632  2/1993  Japan.

OTHER PUBLICATIONS

Y. S. Huang, et al. "Ti-Silicide with improved thermal stability using silicidation through oxide on amorphous silicon substrates" J. Mat. Sci. Lett. 12 (1993) pp. 1726–1728.

Primary Examiner—Olik Chaudhuri
Assistant Examiner—C. Everhart
Attorney, Agent, or Firm—Kenneth C. Hill; Lisa K. Jorgenson; Richard K. Robinson

[57] ABSTRACT

A method for fabricating an interconnect structure in an integrated circuit. A first conductive layer is formed over an underlying region in the integrated circuit. The underlying region may be, for example, a semiconductor substrate or a gate electrode. A buffer layer is then formed over the first conductive layer, followed by the formation of an insulating layer over the buffer layer. The insulating layer and the buffer layer are patterned to define a form for the interconnect structure. A second conductive layer is then formed over the integrated circuit, and portions of the first conductive layer, the second conductive layer, and the buffer layer are silicided to form the interconnect structure.

9 Claims, 2 Drawing Sheets

METHOD FOR FABRICATING AN INTERCONNECT STRUCTURE IN AN INTEGRATED CIRCUIT

This is a division of application Ser. No. 07/891,450, filed May 29, 1992, now U.S. Pat. No. 5,313,084.

BACKGROUND OF THE INVENTION

1. Field of the Invention

The present invention relates generally to the fabrication of integrated circuits, and more particularly to a structure and method for fabricating an interconnect structure in an integrated circuit.

2. Description of the Prior Art

As integrated circuits become more and more complex, the need for increased packaging density, reduced device parasitics, and low resistivity interconnects increases. Buried contacts and self-aligned contact techniques have been developed to increase packaging density. Similarly, silicides are utilized to reduce device parasitics as well as interconnect resistances.

One method known in the art to form a silicided interconnect utilizes a refractory metal, such as titanium, and amorphous silicon. A patterned layer of amorphous silicon is formed over a layer of refractory metal, and the integrated circuit is then annealed to form silicide. The silicide creates the interconnect structure. Those skilled in the art will recognize that during silicidation a monocrystalline silicon, such as a semiconductor substrate, is consumed faster than amorphous silicon. Furthermore, because the amorphous silicon layer is typically consumed during the silicidation process, a thicker silicided layer is formed in the area covered with the amorphous silicon layer than in the areas not covered with the amorphous silicon layer.

This difference between the silicidation rates of amorphous silicon and a monocrystalline silicon such as a semiconductor substrate can lead to problems with the integrated circuit. Forming a thick silicided area utilizing amorphous silicon over a source/drain region within a semiconductor substrate can cause dopants in the source/drain regions to out-diffuse through the silicide to other areas and reduce the effective junction concentration, resulting in junction leakage. This phenomena is due to the fact that the monocrystalline silicon in the semiconductor substrate is consumed faster than the amorphous silicon during the silicidation process. Those skilled in the art will recognize that losing the silicon in the source/drain regions during silicidation and having dopants out-diffuse into other areas can lead to the problem of junction leakage.

Therefore, it would be desirable to provide a method to form interconnect structures which limits the thickness of the interconnect structure, minimizes diffusion of dopants, and which reduces the potential for junction leakage. It is also desirable that such a method not significantly increase the complexity of the fabrication process.

SUMMARY OF THE INVENTION

A method is provided for fabricating an interconnect structure in an integrated circuit. A first conductive layer is formed over an underlying region in the integrated circuit. The underlying region may be, for example, a semiconductor substrate or a gate electrode. A buffer layer is then formed over the first conductive layer, followed by the formation of an insulating layer over the buffer layer. The insulating layer and the buffer layer are patterned to define a form for the interconnect structure. A second conductive layer is then formed over the integrated circuit, and portions of the first conductive layer, the second conductive layer, and the buffer layer are silicided to form the interconnect structure.

BRIEF DESCRIPTION OF THE DRAWINGS

The novel features believed characteristic of the invention are set forth in the appended claims. The invention itself however, as well as a preferred mode of use, and further objects and advantages thereof, will best be understood by reference to the following detailed description of an illustrative embodiment when read in conjunction with the accompanying drawings, wherein:

DESCRIPTION OF THE PREFERRED EMBODIMENT

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate the important features of the invention.

Figure 1:
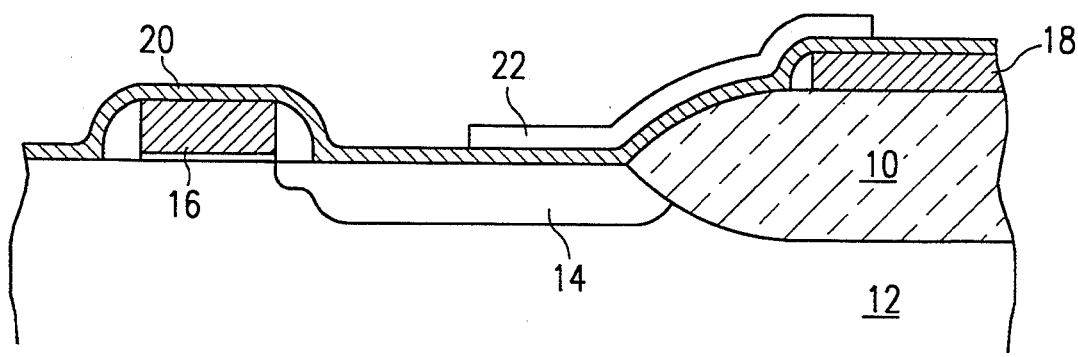
FIGS. 1-2 are cross sectional views of an integrated circuit illustrating a prior art structure and method for fabricating an interconnect structure in an integrated circuit.
Figure 2:
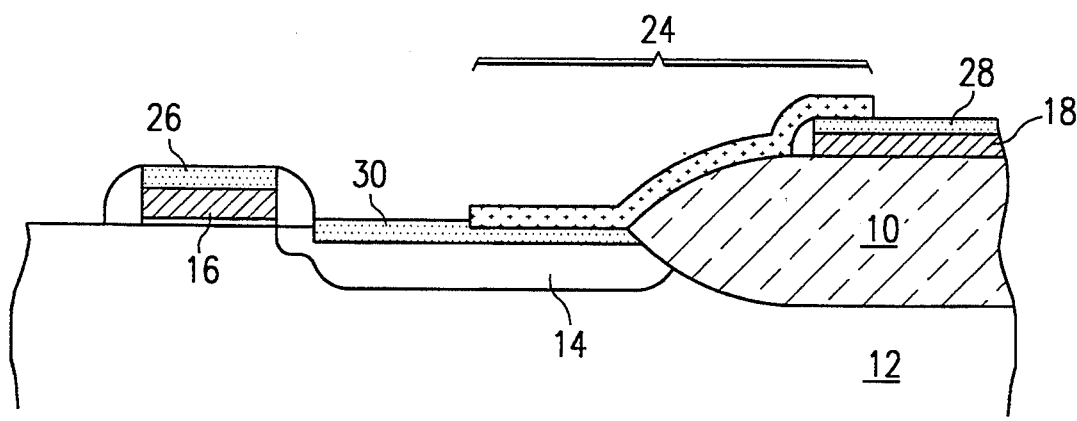

FIGS. 1-2 are cross sectional views of an integrated circuit illustrating a prior art structure and method for fabricating an interconnect structure in an integrated circuit. Referring to FIG. 1, an isolation region 10 and a source/drain region 14 are formed in a semiconductor substrate 12 in an integrated circuit. Gate electrodes 16, 18 are then formed on an underlying region in the integrated circuit. The underlying region may be, for example, the semiconductor substrate 12 or the isolation region 10. A conductive layer 20 is deposited over the integrated circuit, followed by depositing and patterning a buffer layer 22. In the preferred embodiment, the conductive layer 20 is made of a refractory metal such as titanium, and the buffer layer 22 is made of amorphous silicon.

FIG. 2 illustrates the integrated circuit after the integrated circuit is annealed in nitrogen and portions of the conductive layer 20 and the buffer layer 22 are silicided. The unreacted portions of the conductive layer 20 and the upper part of the conductive layer 20 which is converted to a nitride are then removed by an isotropic etch. In the preferred embodiment, the silicidation process forms titanium nitride and titanium disilicide. The titanium nitride and the unreacted portions of titanium are removed, forming an interconnect structure made of titanium disilicide.

An interconnect structure 24 is then formed, as well as silicided regions 26, 28 on the upper surface of the gate electrodes 16, 18 and a silicided region 30 in the semiconductor substrate 12. As can be seen, the interconnect structure 24 is thicker than the other silicide areas, and a portion of the thick interconnect structure 24 overlies a portion of the source/drain region 14. Because the silicon in the source/drain region 14 is a monocrystalline silicon, it is consumed faster than the amorphous silicon during silicidation, forming a thicker silicided area under the buffer layer 22 in the source/drain region 14. This can cause dopants in the source/drain region 14 to out-diffuse into the interconnect structure 24 and the silicided region 28. The loss of monocrystalline silicon in the source/drain region 14 and the out-diffusion of dopants can lead to a problem of junction leakage. In addition, dopants in gate electrode 18 can out-diffuse through the interconnect structure 24 into the source/drain region 14 and cause anti-doping problems when the gate electrode 18 and the source/drain region 14 are not doped with the same type of dopants.

Figure 3:
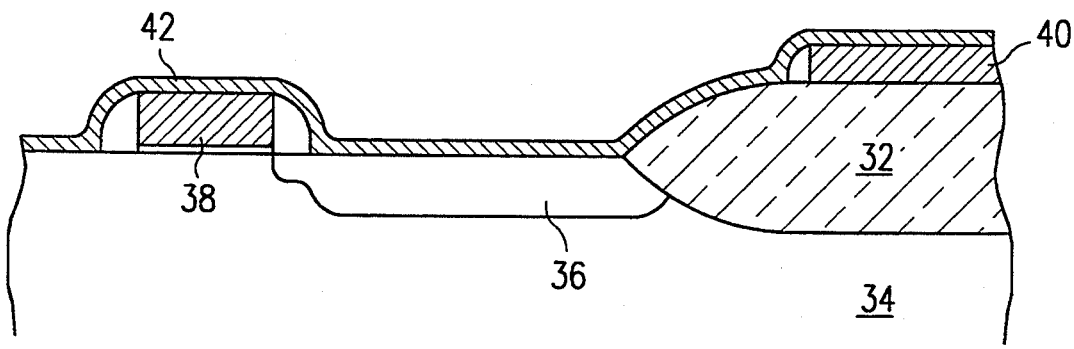
FIGS. 3-6 are cross sectional views of an integrated circuit illustrating a preferred structure and method for fabricating an interconnect structure in an integrated circuit.

FIGS. 3-6 are cross sectional views of an integrated circuit illustrating a preferred structure and method for fabricating an interconnect structure in an integrated circuit. Referring to FIG. 3, an isolation region 32 and a source/drain region 36 are formed in a semiconductor substrate 34 in the integrated circuit. Gate electrodes 38, 40 are then formed on an underlying region in the integrated circuit. The underlying region may be, for example, the semiconductor substrate 34 or the isolation region 32. A first conductive layer 42 is then deposited over the integrated circuit. In the preferred embodiment, the first conductive layer 42 is made of titanium and is deposited to a thickness of approximately 200 angstroms.

Figure 4:
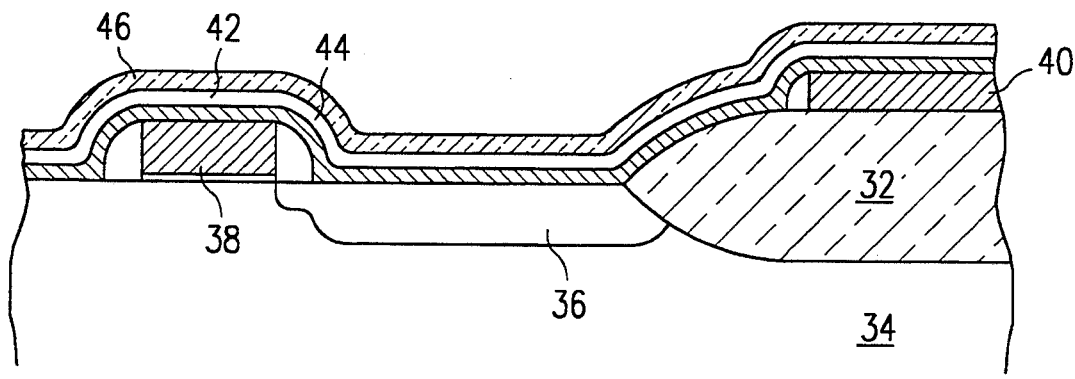

FIG. 4 illustrates the integrated circuit after a buffer layer 44 is deposited over the first conductive layer 42, and an insulating layer 46 is deposited over the buffer layer 44. In the preferred embodiment, the buffer layer 44 is made of amorphous silicon, and the insulating layer 46 is made of oxide.

Figure 5:
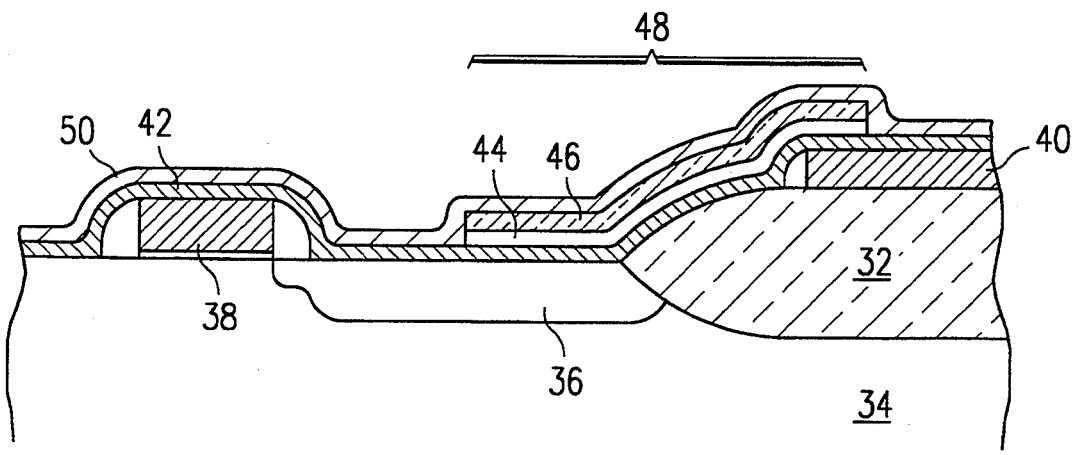

Referring to FIG. 5, the insulating layer 46 and the buffer layer 44 are patterned to define a form 48 for an interconnect structure. A second conductive layer 50, also preferably made of a refractory metal such as titanium, is then deposited over the integrated circuit.

Figure 6:
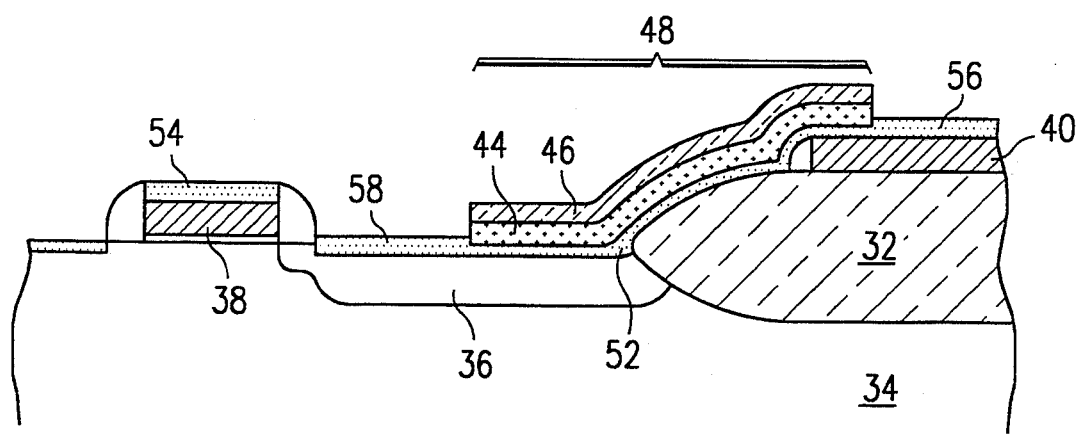

FIG. 6 illustrates the integrated circuit after the integrated circuit is annealed in nitrogen and portions of the first conductive layer 42, the buffer layer 44, and the second conductive layer 50 are silicided. The unreacted portions of the first conductive layer 42 and the second conductive layer 50, in addition to the portions of the second conductive layer 42 which are converted to a nitride, are then removed by an isotropic etch. In the preferred embodiment, the unreacted titanium and titanium nitride are removed.

As can be seen, an interconnect structure 52 is formed below the buffer layer 44. Silicided areas 54, 56 are also formed on the upper surface of conductive structures 38, 40, as well as on a portion 58 of the semiconductor substrate 34. In the preferred embodiment, the interconnect structure 52, silicided areas 54, 56, and the portion 58 are made of titanium disilicide.

The purpose of the first conductive layer 42 is to form the interconnect structure 52. The thickness of the interconnect structure 52 is controlled by the thickness of the first conductive layer 42 and the formation of the overlying buffer layer 44 and insulating layer 46. In the preferred embodiment, the first conductive layer 42 is thin, thereby limiting the amount of silicon in the source/drain region 36 which is consumed during silicidation. This reduces significantly the out-diffusion and counter doping of dopants from source/drain region 36 and gate electrode 14.

The purpose of the second conductive layer 50 is to make the refractory metal thicker in order to form low sheet resistance silicided areas 54, 56 in the gate electrodes 38, 40, and a low sheet resistance silicided area 58 in the source/drain region 36.

Finally, the purpose of the insulating layer 46 overlying the buffer layer 44 is to have a portion of the second conductive layer 50 overlying the insulating layer 46 form a nitride layer. This limits the amount of silicon consumed from the source/drain region 36 during silicidation, which ultimately aids in preventing junction leakage problems.

While the invention has been particularly shown and described with reference to a preferred embodiment, it will be understood by those skilled in the art that various changes in form and detail may be made therein without departing from the spirit and scope of the invention.

What is claimed is:

1. A method for fabricating an interconnect structure in an integrated circuit, comprising the steps of:
    forming a first conductive layer over an underlying region in the integrated circuit;
    forming a buffer layer over the first conductive layer;
    forming an insulating layer over the buffer layer;
    patterning the insulating layer and the buffer layer to define a form for the interconnect structure;
    forming a second conductive layer over the integrated circuit; and
    annealing to form silicide from portions of the first and second conductive layers and the buffer layer, wherein the interconnect structure is formed.

2. The method of claim 1, further comprising the steps of removing unsilicided portions of the first and second conductive layers.

3. The method of claim 1, wherein said step of forming a first conductive layer comprises depositing a thin layer of titanium over the underlying region in the integrated circuit.

4. The method of claim 3, wherein the underlying region comprises a semiconductor substrate.

5. The method of claim 3, wherein said underlying region comprises gate electrodes.

6. The method of claim 1, wherein said step of forming a buffer layer comprises depositing a layer of amorphous silicon over the first conductive layer.

7. The method of claim 1, wherein said step of forming an insulating layer comprises depositing a layer of oxide over the buffer layer.

8. The method of claim 1, wherein said step of forming a second conductive layer comprises depositing a layer of titanium over the integrated circuit.

9. The method of claim 1, wherein said step of siliciding portions of the first and second conductive layers comprises siliciding portions of the first and second conductive layers in a nitrogen ambient.

* * * * *